(12) United States Patent
Tucker et al.

(10) Patent No.: US 9,435,821 B1
(45) Date of Patent: Sep. 6, 2016

(54) SINGLE-AXIS ACCELEROMETER

(71) Applicant: The United States of America as Represented by the Administrator of the National Aeronautics and Space Administration, Washington, DC (US)

(72) Inventors: Dennis Stephen Tucker, Huntsville, AL (US); Pedro A. Capó-Lugo, Huntsville, AL (US)

(73) Assignee: The United States of America as Represented by the Administrator of the National Aeronautics and Space Administration, Washington, DC (US)

( * ) Notice: Subject to any disclaimer, the term of this patent is extended or adjusted under 35 U.S.C. 154(b) by 336 days.

(21) Appl. No.: 14/104,881

(22) Filed: Dec. 12, 2013

(51) Int. Cl.
*G01P 15/09* (2006.01)
*H01L 41/16* (2006.01)

(52) U.S. Cl.
CPC ............... *G01P 15/09* (2013.01); *H01L 41/16* (2013.01)

(58) Field of Classification Search
CPC ....................................................... G01P 15/09
USPC ....................................................... 73/514.34
See application file for complete search history.

(56) References Cited

U.S. PATENT DOCUMENTS

| | | |
|---|---|---|
| 5,237,871 A | 8/1993 | Henderson et al. |
| 6,087,950 A | 7/2000 | Capan |
| 8,408,077 B2 | 4/2013 | Darty et al. |
| 2003/0140699 A1* | 7/2003 | Pike ..................... G01P 15/0802 73/514.32 |
| 2003/0145654 A1 | 8/2003 | Knudsen et al. |
| 2004/0012062 A1* | 1/2004 | Miyajima ............. B81B 3/0021 257/419 |
| 2009/0322260 A1 | 12/2009 | Lee |
| 2012/0060826 A1 | 3/2012 | Weisenberger |
| 2012/0125104 A1* | 5/2012 | Qiu ........................ G01P 15/125 73/514.32 |
| 2013/0104656 A1* | 5/2013 | Smith .................... G01P 15/125 73/514.32 |
| 2013/0118257 A1 | 5/2013 | De Los Santos et al. |
| 2013/0152663 A1 | 6/2013 | Balachandran et al. |

FOREIGN PATENT DOCUMENTS

IN     200500663 I4     7/2007

* cited by examiner

*Primary Examiner* — Hezron E Williams
*Assistant Examiner* — Tarun Sinha
(74) *Attorney, Agent, or Firm* — Peter J. Van Bergen; James J. McGroary

(57) ABSTRACT

A single-axis accelerometer includes a housing defining a sleeve. An object/mass is disposed in the sleeve for sliding movement therein in a direction aligned with the sleeve's longitudinal axis. A first piezoelectric strip, attached to a first side of the object and to the housing, is longitudinally aligned with the sleeve's longitudinal axis. The first piezoelectric strip includes a first strip of a piezoelectric material with carbon nanotubes substantially aligned along a length thereof. A second piezoelectric strip, attached to a second side of the object and to the housing, is longitudinally aligned with the sleeve's longitudinal axis. The second piezoelectric strip includes a second strip of the piezoelectric material with carbon nanotubes substantially aligned along a length thereof. A voltage sensor is electrically coupled to at least one of the first and second piezoelectric strips.

15 Claims, 1 Drawing Sheet

SINGLE-AXIS ACCELEROMETER

ORIGIN OF THE INVENTION

The invention described herein was made by employees of the United States Government and may be manufactured and used by or for the Government of the United States of America for governmental purposes without the payment of any royalties thereon or therefor.

BACKGROUND OF THE INVENTION

1. Field of the Invention

This invention relates to accelerometers. More specifically, the invention is a single-axis accelerometer.

2. Description of the Related Art

Conventional accelerometers generally utilize a pendulum's movement or a piezoelectric material to sense acceleration. Pendulum-based accelerometers are relatively large and expensive. Piezoelectric-based accelerometers are traditionally made from ceramic materials such as barium titanate ($BaTiO_3$) or lead titanate (PZT). However, these materials are inherently brittle, have a tendency to be noisy, have difficulty sensing low frequencies, and are subject to static charge build-up that affects polarization. Still further, piezoelectric materials used in "micro electro-mechanical machine system" (MEMS) accelerometers behave as a spring system that generates noise requiring compensation.

SUMMARY OF THE INVENTION

Accordingly, it is an object of the present invention to provide an accelerometer.

Another object of the present invention is to provide a carbon nanotube-piezoelectric-based accelerometer that avoids the drawbacks generally associated therewith.

Other objects and advantages of the present invention will become more obvious hereinafter in the specification and drawings.

In accordance with the present invention, a single-axis accelerometer includes a housing defining a sleeve having a longitudinal axis. An object having a mass is disposed in the sleeve for sliding movement therein in a direction aligned with the sleeve's longitudinal axis. A first piezoelectric strip is attached to a first side of the object and to the housing. The first piezoelectric strip is longitudinally aligned with the sleeve's longitudinal axis. The first piezoelectric strip includes a first strip of a piezoelectric material with carbon nanotubes substantially aligned along a length of the first strip. A second piezoelectric strip is attached to a second side of the object and to the housing. The second side of the object opposes its first side. The second piezoelectric strip is longitudinally aligned with the sleeve's longitudinal axis. The second piezoelectric strip includes a second strip of the piezoelectric material with carbon nanotubes substantially aligned along a length of the second strip. A voltage sensor is electrically coupled to at least one of the first piezoelectric strip and second piezoelectric strip.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein.

DESCRIPTION OF THE PREFERRED EMBODIMENT(S)

Figure 1:
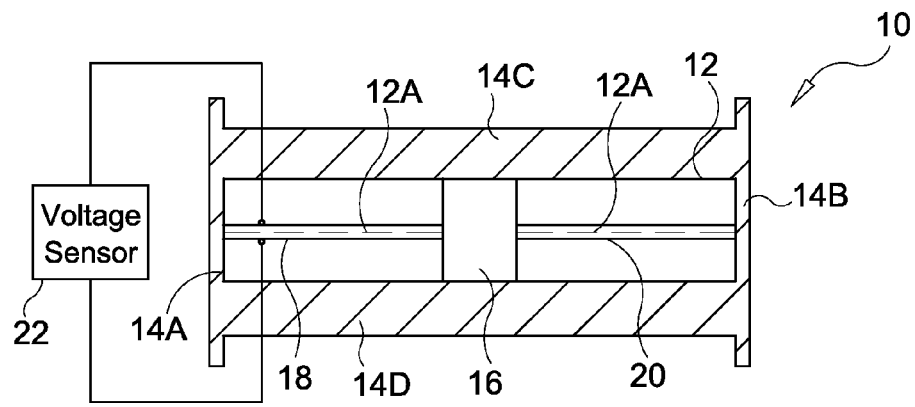
FIG. 1 is a side schematic view of a single-axis accelerometer in accordance with an embodiment of the present invention.

Referring now to the drawings and more particularly to FIG. 1, a single-axis accelerometer in accordance with an embodiment of the present invention is shown and is referenced generally by numeral 10. Accelerometer 10 is a piezoelectric-based accelerometer that can be oriented in any of a variety of ways to measure acceleration along a particular direction (e.g., acceleration due to gravity, some applied motive force, etc.). Accordingly, it is to be understood that the orientation of the accelerometer shown in the figures is not a limitation of the present invention.

Accelerometer 10 includes a housing that defines a sleeve 12 having a longitudinal axis indicated by dashed line 12A. In the illustrated embodiment, the housing includes opposing end walls 14A and 14B, and opposing sidewalls 14C and 14D such that sleeve 12 is tubular in nature. For example, side walls 14C and 14D could be partial or half cylinders so that sleeve 12 is cylindrical in cross-section.

Disposed in sleeve 12 for sliding movement therein is an object 16 having a mass. More specifically, sleeve 12 constrains sliding movement of object 16 to a single dimension or axis aligned with longitudinal axis 12A. Such sliding movement in either direction (e.g., left or right in the illustrated orientation of accelerometer 10) is indicative of acceleration in the opposite direction. That is, acceleration is to the right when object 16 slides to the left, and acceleration is to the left when object 16 slides to the right. Accordingly, the surfaces of sleeve 12 and object 16 that will come into contact with one another should be configured/constructed to minimize friction in ways well understood in the art.

Object 16 is positioned (e.g., centered) in sleeve 12 by piezoelectric strips 18 and 20 disposed in the air space in sleeve 12 on either side of object 16. More specifically, each piezoelectric strip 18 and 20 is coupled to object 16 and to a portion of the housing defining sleeve 12. In the illustrated embodiment, the ends of piezoelectric strip 18 are affixed to end wall 14A and one side of object 16. The ends of piezoelectric strip 20 are affixed to the opposing side of object 16 and end wall 14B. Strips 18 and 20 are aligned along the longitudinal axis 12A of sleeve 12.

A voltage sensor 22 (e.g., meter) is electrically coupled to one of piezoelectric strips 18 and 20. For purpose of the present invention, voltage sensor 22 is coupled to piezoelectric strip 18 across the thickness thereof. In this way, when accelerometer 10 experiences acceleration along a direction aligned with the sleeve's longitudinal axis 12A, voltage sensor 22 will sense positive/negative voltage changes induced in piezoelectric strip 18 due to either compression of strip 18 (i.e., acceleration to the right) or tension in strip 18 (i.e., acceleration to the left). A second voltage sensor (not shown) could be electrically coupled to piezoelectric strip 20 without departing from the present invention.

Figure 2:
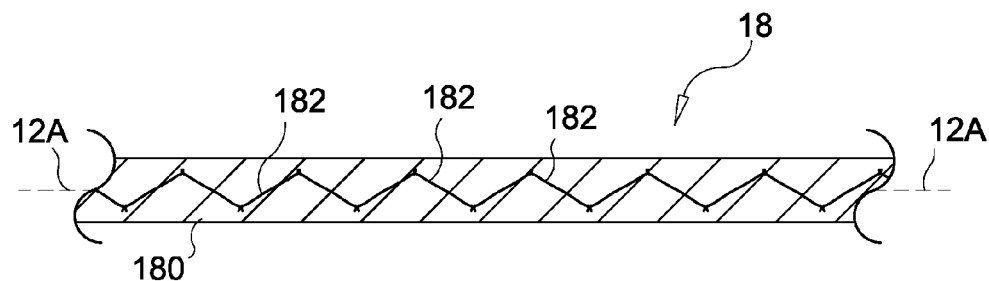
FIG. 2 is a cross-sectional view of a piezoelectric strip used in the accelerometer in accordance with an embodiment of the present invention.

In the present invention, each of piezoelectric strips 18 and 20 is configured in the same fashion and includes a matrix of piezoelectric material with carbon nanotubes (CNTs) therein. More specifically and with reference to FIG. 2, a portion of piezoelectric strip 18 is shown in cross-section where the piezoelectric matrix is referenced by numeral 180 and the CNTs are referenced by numeral 182. CNTs 182 are substantially aligned along the length of strip 18 such that they are also substantially aligned along the length of the sleeve's longitudinal axis 12A when strip 18 is included in accelerometer 10. For purposes of the present invention, CNTs 182 can occupy approximately 30 to approximately 50 volume percent of strip 18. The piezoelectric matrix 180 can be a flexible piezoelectric material such as polyvinylidene fluoride (P(VDF)) or polyvinylidene trifluoroethylene (P(VDF-TrFE)). To enhance the piezoelectric effect produced by piezoelectric strip 18, additives such as magnesium niobate-lead titanate (PMN-PT), lead zirconium titanate (PZT), and barium titanate (BaTiO$_3$) can be added to piezoelectric matrix 180.

A variety of techniques can be used to fabricate piezoelectric strips 18 and 20. For example, piezoelectric matrix 180 could be sprayed onto CNTs 182 as the CNTs were being drawn and then wound onto a spool. The drawing of CNTs 182 will cause their substantial alignment as the matrix material is sprayed thereon. To facilitate spraying, the piezoelectric matrix material can be mixed into a solvent (e.g., DMF) that will ultimately evaporate leaving just the piezoelectric matrix material 180 encapsulating the substantially aligned CNTs 182. The desired lengths for strips 18 and 20 can then be cut.

Figure 3:
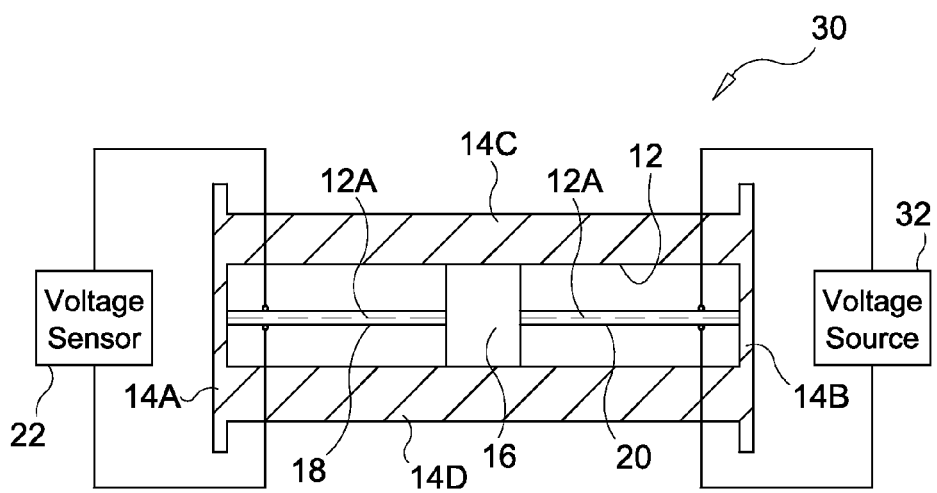
FIG. 3 is a side schematic view of a single-axis accelerometer employing active damping in accordance with another embodiment of the present invention.

Another accelerometer embodiment of the present invention is illustrated in FIG. 3 and is referenced generally by numeral 30. The elements of accelerometer 30 that are the same as accelerometer 10 are referenced with the same numerals and will not be described again herein. Accelerometer 30 is actively damped by including a voltage source 32 electrically coupled to piezoelectric strip 20. Voltage source 32 is coupled across the thickness of strip 20. In general, voltage source 32 applies a voltage to strip 20 to actively dampen oscillations in strip 20 when accelerometer 30 experiences acceleration along longitudinal axis 12A. Accordingly, accelerometer 30 is effectively a spring-damper system that can dampen oscillations that are inherent in piezoelectric materials in order to improve the response of accelerometer 30. Since piezoelectric strip 20 also includes CNTs therein, minimal voltage is needed to make piezoelectric strip 20 act as a damper. This will allow accelerometer 30 to be miniaturized and utilize low voltage levels typically available from conventional microcontrollers.

The advantages of the present invention are numerous. A simple single-axis accelerometer avoids the size constraints of pendulum-based accelerometers and avoids the drawbacks of conventional piezoelectric-based accelerometers. The piezoelectric strips are flexible and less noisy than ceramic materials, but are more responsive due to the inclusion of CNTs. The accelerometer can be actively damped with a low-level voltage to improve response.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A single-axis accelerometer, comprising:
   a housing defining a sleeve having a longitudinal axis;
   an object having a mass disposed in said sleeve for sliding movement therein in a direction aligned with said longitudinal axis;
   a first piezoelectric strip attached to a first side of said object and attached to said housing, said first piezoelectric strip longitudinally aligned with said longitudinal axis, said first piezoelectric strip including a first strip of a piezoelectric material with carbon nanotubes substantially aligned along a length of said first strip;
   a second piezoelectric strip attached to a second side of said object and attached to said housing, said second side opposing said first side, said second piezoelectric strip longitudinally aligned with said longitudinal axis, said second piezoelectric strip including a second strip of said piezoelectric material with carbon nanotubes substantially aligned along a length of said second strip; and
   a voltage sensor electrically coupled to at least one of said first piezoelectric strip and said second piezoelectric strip.

2. A single-axis accelerometer as in claim 1, wherein said piezoelectric material is selected from the group consisting of polyvinylidene fluoride (P(VDF)) and polyvinylidene trifluoroethylene (P(VDF-TrFE)).

3. A single-axis accelerometer as in claim 1, further comprising additives mixed in said piezoelectric material, said additives being selected from the group consisting of magnesium niobate-lead titanate (PMN-PT), lead zirconium titanate (PZT), and barium titanate (BaTiO$_3$).

4. A single-axis accelerometer as in claim 2, further comprising additives mixed in said piezoelectric material, said additives being selected from the group consisting of magnesium niobate-lead titanate (PMN-PT), lead zirconium titanate (PZT), and barium titanate (BaTiO$_3$).

5. A single-axis accelerometer as in claim 1, further comprising a voltage source coupled to one of said first piezoelectric strip and said second piezoelectric strip.

6. A single-axis accelerometer, comprising:
   a housing defining a sleeve having a longitudinal axis;
   an object having a mass disposed in and constrained by said sleeve for sliding movement therein only in a direction aligned with said longitudinal axis;
   a first piezoelectric strip attached to a first side of said object and attached to said housing, said first piezoelectric strip longitudinally aligned with said longitudinal axis, said first piezoelectric strip including a first strip of a piezoelectric material with carbon nanotubes embedded in and substantially aligned along a length of said first strip;
   a second piezoelectric strip attached to a second side of said object and attached to said housing, said second side opposing said first side, said second piezoelectric strip longitudinally aligned with said longitudinal axis, said second piezoelectric strip including a second strip of said piezoelectric material with carbon nanotubes embedded in and substantially aligned along a length of said second strip; and
   a voltage sensor electrically coupled to one of said first piezoelectric strip and said second piezoelectric strip.

7. A single-axis accelerometer as in claim 6, wherein said piezoelectric material is selected from the group consisting of polyvinylidene fluoride (P(VDF)) and polyvinylidene trifluoroethylene (P(VDF-TrFE)).

8. A single-axis accelerometer as in claim 6, further comprising additives mixed in said piezoelectric material, said additives being selected from the group consisting of magnesium niobate-lead titanate (PMN-PT), lead zirconium titanate (PZT), and barium titanate (BaTiO$_3$).

9. A single-axis accelerometer as in claim 7, further comprising additives mixed in said piezoelectric material, said additives being selected from the group consisting of magnesium niobate-lead titanate (PMN-PT), lead zirconium titanate (PZT), and barium titanate (BaTiO$_3$).

10. A single-axis accelerometer as in claim 6, further comprising a voltage source coupled to one of said first piezoelectric strip and said second piezoelectric strip.

11. A single-axis accelerometer, comprising:
a housing defining a sleeve having a longitudinal axis;
an object having a mass disposed in and constrained by said sleeve for sliding movement therein only in a direction aligned with said longitudinal axis, wherein air spaces are defined in said sleeve on opposing sides of said object;
a first piezoelectric strip attached to a first of said opposing sides of said object and attached to said housing, said first piezoelectric strip disposed in one of said air spaces and longitudinally aligned with said longitudinal axis, said first piezoelectric strip including a first strip of a piezoelectric material with carbon nanotubes embedded in and substantially aligned along a length of said first strip, said carbon nanotubes occupying approximately 30-50 volume percent of said first piezoelectric strip;
a second piezoelectric strip attached to a second of said opposing sides of said object and attached to said housing, said second piezoelectric strip disposed in another of said air spaces and longitudinally aligned with said longitudinal axis, said second piezoelectric strip including a second strip of said piezoelectric material with carbon nanotubes embedded in and substantially aligned along a length of said second strip, said carbon nanotubes occupying approximately 30-50 volume percent of said second piezoelectric strip; and
a voltage sensor electrically coupled to one of said first piezoelectric strip and said second piezoelectric strip.

12. A single-axis accelerometer as in claim 11, wherein said piezoelectric material is selected from the group consisting of polyvinilydene fluoride (P(VDF)) and polyvinilydene trifluoroethylene (P(VDF-TrFE)).

13. A single-axis accelerometer as in claim 11, further comprising additives mixed in said piezoelectric material, said additives being selected from the group consisting of magnesium niobate-lead titanate (PMN-PT), lead zirconium titanate (PZT), and barium titanate (BaTiO$_3$).

14. A single-axis accelerometer as in claim 12, further comprising additives mixed in said piezoelectric material, said additives being selected from the group consisting of magnesium niobate-lead titanate (PMN-PT), lead zirconium titanate (PZT), and barium titanate (BaTiO$_3$).

15. A single-axis accelerometer as in claim 11, further comprising a voltage source coupled to another of said first piezoelectric strip and said second piezoelectric strip.

* * * * *